United States Patent
Nakano

[11] Patent Number: 6,147,923
[45] Date of Patent: Nov. 14, 2000

[54] VOLTAGE BOOSTING CIRCUIT

[75] Inventor: Akihiro Nakano, Kawasaki, Japan

[73] Assignee: Fujitsu Limited, Kawasaki, Japan

[21] Appl. No.: 09/343,404

[22] Filed: Jun. 30, 1999

[30] Foreign Application Priority Data

Jul. 2, 1998 [JP] Japan .................................. 10-187893

[51] Int. Cl.[7] .................................................. G11C 7/00
[52] U.S. Cl. ...................... 365/226; 365/189.09; 365/102
[58] Field of Search .............................. 365/189.11, 102, 365/189.09, 226

[56] References Cited

U.S. PATENT DOCUMENTS

| | | | |
|---|---|---|---|
| 3,646,369 | 2/1972 | Fujimoto .................................. | 307/270 |
| 4,639,622 | 1/1987 | Goodwin et al. ....................... | 307/482 |
| 5,751,158 | 5/1998 | Loughmiller ............................ | 324/763 |
| 5,781,426 | 7/1998 | Matsushita ................................ | 363/60 |
| 5,877,650 | 3/1999 | Matsushita ............................... | 327/536 |

*Primary Examiner*—David Nelms
*Assistant Examiner*—Thong Le
*Attorney, Agent, or Firm*—Arent Fox Kintner Plotkin & Kahn, PLLC

[57] ABSTRACT

An NMOS capacitor 13 and a PMOS capacitor 18 for pumping up are connected in series to an output line 12. In middle point voltage control circuit 20, a power supply line at VCC is connected via a PMOS transistor 21 to the anode of a reverse-flow preventing diode 22 and the node of voltage VM, the cathode of the diode 22 is connected via an NMOS transistor 23 to a ground line, and control signals *BIN and AIN are provided to the gate electrodes of the transistors 21 and 23, respectively, in response to an address transition detection signal AT. An end point voltage control circuit 30 is connected between the gate electrode of the NMOS transistor 23 and one end of the PMOS capacitor 18, and is equipped with inverters 31 and 32 connected in series. In an initial state, VM is at 0V and VE and VOUT is at VCC. Next the node of VM becomes a floating state and VE is lowered to 0V. Finally the node of VM is raised to VCC to boost VOUT from VCC up to VCC(2+α), where 0<α<1.

11 Claims, 9 Drawing Sheets

VOLTAGE BOOSTING CIRCUIT

BACKGROUND OF THE INVENTION

1. Field of the Invention

The present invention relates to a voltage boosting circuit for use in a semiconductor device such as a memory device.

2. Description of the Related Art

In a semiconductor memory using an NMOS transistor as a transfer gate, in order to turn on the NMOS transistor, whose gate electrode is connected to a long word line, at a high speed and to compensate a voltage drop at the NMOS transistor and on the word line, the voltage VOUT applied to the word line must be made higher than the power supply voltage VCC. For example, in a case where the power supply voltage VCC is 2V, the applied voltage VOUT is made to 4V. In order to generate this higher voltage VOUT, such a voltage boosting circuit 10 as shown in FIG. 8 is used.

In this circuit, the power supply voltage VCC is connected via diode 11 to an output line 12, and the boosted voltage VOUT is taken out from the output line 12. In a case where the power supply voltage VCC is more than 3 V, the voltage VOUT will be converted into a desired value by once pumping-up operation. However, if the power supply voltage VCC is less than 2V, twice or more pumping-up operations will be required. Therefore, pumping-up NMOS capacitors 13 and 14 are connected in series to the output line 12. Inverter 15 is connected via the NMOS transistor 16 to the node of a voltage VM between the NMOS capacitors 13 and 14, and a control signal *BIN is provided to the inverter 15. Herein, * denotes that the signal is active low. The output of a inversion delay circuit 17, constructed of inverters 17A through 17C connected in series, is connected to one end (voltage VE) of the NMOS capacitor 14, and the control signal *BIN is provided to the input of the inverter 17A.

FIG. 9 are time charts showing the operation of the circuit of FIG. 8.

In the initial state, the control signal *BIN is high, whereby the output of the inverter 15 is low, the NMOS transistor 16 is on, the output of inverter 17C goes low, and the voltages VM and VE each are 0V. In this state, the voltage of the NMOS capacitor 13 is VCC.

When the control signal *BIN turns to low, the output of the inverter 15 goes high, current from the inverter 15 flows to the NMOS transistor 16 to raise the voltage VM with the diode 11 being off, and when VM has reached to (VCC−Vth), the NMOS transistor 16 is turned off, where Vth is a threshold voltage of the NMOS transistor 16. Following up the rise of the voltage VM, the voltage VOUT is boosted. After the NMOS transistor 16 is turned off, namely the node of the voltage VM is in a floating state, the output of the inverter 17C turns to high, and the voltage VE is raised to VCC. Following up this, the voltages VM and VOUT are boosted.

A circuit which is similar to the above circuit and based on the same principle is disclosed in Japanese Laid-open Patent Publication No. 58-81325.

However, since the on-resistance of the NMOS transistor 16 becomes greater as the voltage VM approaches (VCC−Vth), the time period from the beginning of the output of the inverter 15 being high until the NMOS transistor 16 becoming off is relatively long. It is necessary that the voltage VE must be raised after the NMOS transistor 16 has turned off, therefore the rise time of the voltage VOUT by means of two-step boosting becomes longer. The rise time of the VOUT is, for example, 20 ns. Accordingly, speeding up memory access is prevented.

SUMMARY OF THE INVENTION

It is therefore an object of the present invention to provide a voltage boosting circuit with a faster boosting.

In the present invention, there is provided a voltage boosting circuit comprising: a first capacitor having first and second electrodes mutually isolated, the first electrode being a boosted voltage output; a switching element coupled between a first power supply conductor and the first electrode, for preventing a current from flowing from the first electrode to the first power supply conductor; a second capacitor having first and second electrode mutually isolated, the first electrode thereof being coupled to the second electrode of the first capacitor; a middle point voltage control circuit for making: in a first period, on between the second electrode of the first capacitor and a first reference conductor at a lower voltage than that of the first power supply conductor; in a second period after the first period, off between the second electrode of the first capacitor and the first reference conductor; and in a third period after the second period, on between the second electrode of the first capacitor and a second power supply conductor at a higher voltage than that of the first reference conductor; and an end point voltage control circuit for making: in the first period, on between the second electrode of the second capacitor and a third power supply conductor at a higher voltage than that of the first reference conductor; and in the second period with being off between the second electrode of the first capacitor and the first reference conductor, on between the second electrode of the second capacitor and a second reference conductor at a lower voltage than that of the third power supply conductor.

It is assumed that the on-voltage of each switching element is zero herein after for simplification. Denoting the voltages of the first, 2nd and third power supply conductor, the first and 2nd reference conductor, the first and 2nd electrodes of the first capacitor, and the 2nd electrode of the 2nd capacitor as VCC1, VCC2, VCC3, VSS1, VSS2, VOUT, VM and VE, respectively, the operation of the present invention will be described below.

(1) In the first period VOUT, VM and VE are VCC1, VSS1 and VCC3, respectively.

(2) In the second period

The node of VM be comes a floating state, and in this state VE drops from VCC3 to VSS2. Following up this, VM drops from VSS1 to (VSS1−α·(VCC3−VSS2)), where a value of α depends on the capacities of the first and second capacitor and 0<α<1. VOUT remains at VCC1.

Since the operation in the second period becomes faster than in the prior art.

(3) In the third period VM rises from (VSS1−α·(VCC3−VSS2)) to VCC2. Following up this, VOUT is boosted from VCC1 to (VCC1+(VCC2−(VSS1−α·(VCC3−VSS2)))). For example, if VCC1=VCC2=VCC3 and VSS1=VSS2=0, then VOUT is boosted from VCC to VCC(2+α).

Since the node of VM can immediately turn to a floating state in the second period, and the boosting of VOUT is performed only once in the third period, it is possible to make the boosting operation faster than in the prior art of slow turning to a floating state and twice boosting.

Other aspects, objects, and the advantages of the present invention will become apparent from the following detailed description taken in connection with the accompanying drawings.

DESCRIPTION OF THE PREFERRED EMBODIMENT

Figure 1:
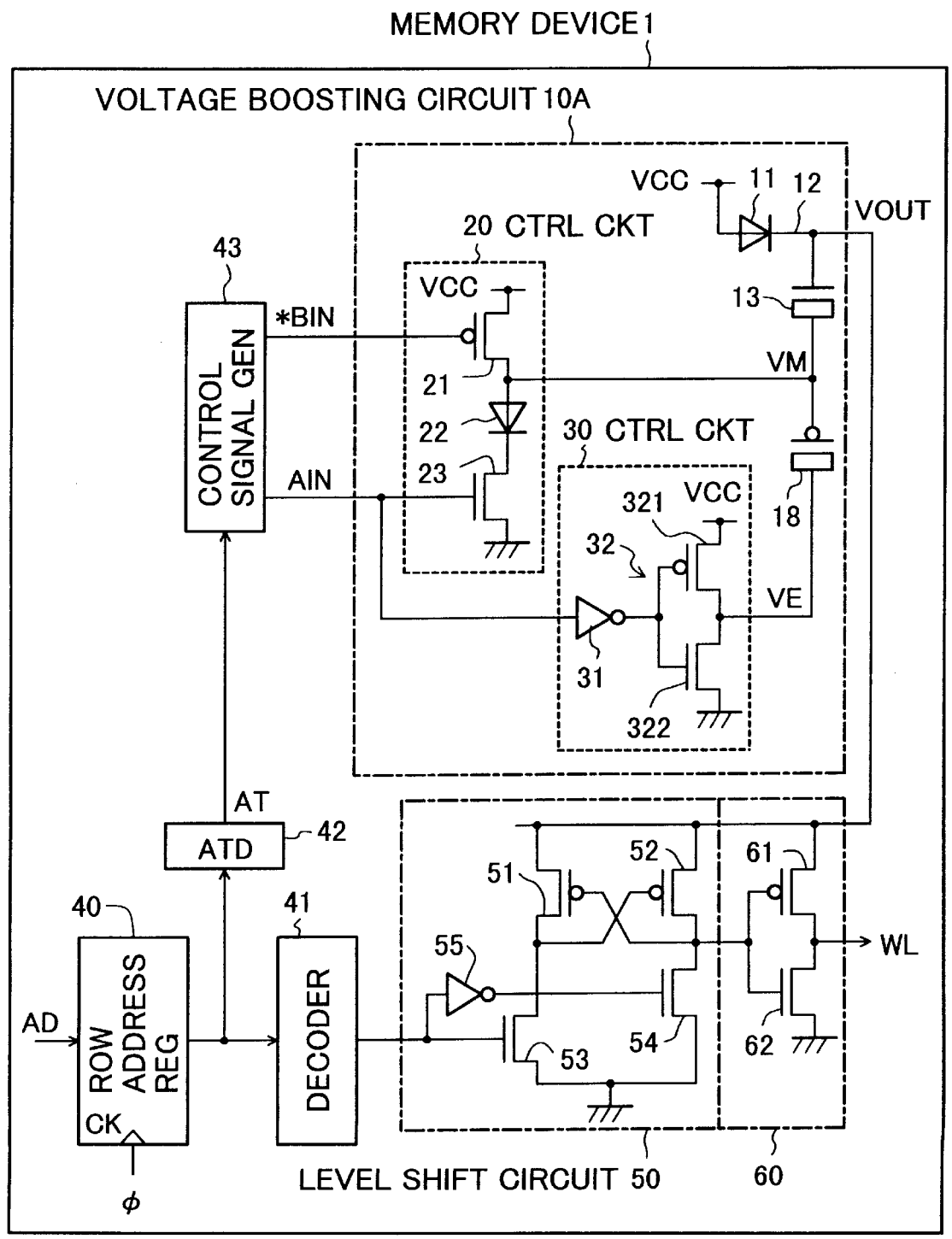
FIG. 1 is a circuit diagram showing a semiconductor memory device in which a voltage boosting circuit of the present invention is applied.

Referring now to the drawings, wherein like reference characters designate like or corresponding parts throughout several views, a preferred embodiment of the present invention is described below. It should be noted that the use of the terms "connected" and "coupled" indicates an electrical connection between two elements and can include an intervening element between the two "coupled" or "connected" elements.

Referring to FIG. 1, a semiconductor memory device 1 is equipped with a voltage boosting circuit 10A which step up the power supply voltage VCC to a given voltage VOUT.

The voltage VOUT is supplied to a selected word line WL, whereby transfer gates of memory cells (not shown) connected to the word line WL are turned on.

In the voltage boosting circuit 10A, the power supply line at VCC is connected via a diode 11 for preventing reverse-flow, or as a switching element, to an output line 12, and an NMOS capacitor 13 and a PMOS capacitor 18 for pumping-up are connected in series to the output line 12. Pumping-up of the voltage VOUT with using the capacitors 13 a nd 18 is performed by a middle point voltage control circuit 20 and an end point voltage control circuit 30.

The middle point voltage control circuit 20 is for controlling the node voltage VM between the capacitors 13 and 18 in response to control signals AIN and *BIN. In the circuit 20, the power supply voltage VCC is connected via a PMOS transistor 21 to the anode of a diode 22 for preventing reverse-flow, or as a switching element, and the node of the voltage VM, and the cathode of the diode 22 is connected via an NMOS transistor 23 to the ground line. The gate electrodes of the PMOS transistor 21 and NMOS transistor 23 receive the control signals *BIN and AIN, respectively.

The end point voltage control circuit 30 is connected between the gate of the NMOS transistor 23 and one end (voltage VE) of the PMOS capacitor 18, and equipped with inverters 31 and 32 connected in series. The inverter 32 consists of a PMOS transistor 321 and an NMOS transistor 322 connected in series between the power supply line at VCC and the ground line.

The structure except for the voltage boosting circuit 10A is well known in the art. The row address AD is latched in a row address resistor 40 on a rise of a clock φ and is provided to a row address decoder 41 and an address transition detecting circuit 42. A control signal generating circuit 43 generates control signals AIN and *BIN for boosting in response to an address transition detection signal AT from the circuit 42. One of the output lines of the row address decoder 41 is connected to the input of a level shift circuit 50, and the output of the circuit 50 is connected via a word driver 60 to the word line WL.

To the level shift circuit 50 and the word driver 60, VOUT is provided as a power supply voltage. The level shift circuit 50 comprises PMOS transistors 51 and 52 cross-coupled to each other, NMOS transistors 53 and 54 connected in series to the transistors 51 and 52, respectively, and an inverter 55 connected between the gate electrodes of the transistors 51 and 52. The word driver 60 is a CMOS inverter in which a PMOS transistor 61 and an NMOS transistor 62 are connected in series.

When the input to the level shift circuit 50 turns low, NMOS transistors 53 and 54 turn off and on, transistors 51 and 52 turn on and off, transistors 61 and 62 turn on and off, respectively, whereby the word line WL goes high. Conversely, when the input to the level shift circuit 50 turns high, the NMOS transistors 53 and 54 turn on and off, transistors 51 and 52 turn off and on, and the transistors 61 and 62 turn off and on, respectively, whereby the word line WL goes low.

Figure 3:
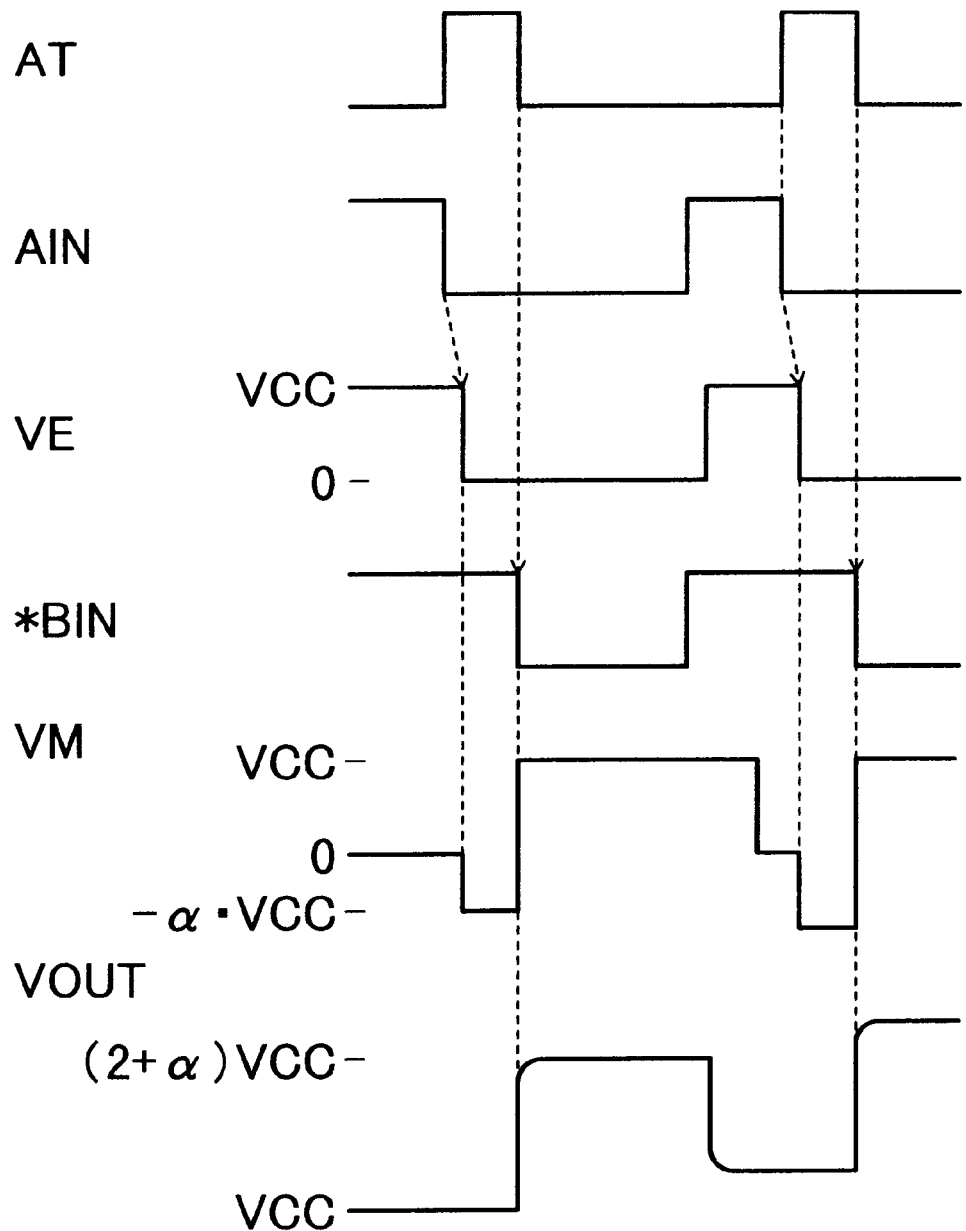
FIG. 3 are time charts showing the operation of the voltage boosting circuit shown in FIG. 1.

Next, operation of the embodiment construct ed as mentioned above will be described with reference to time charts of FIG. 3.

(A) Initial state

Figure 2A:
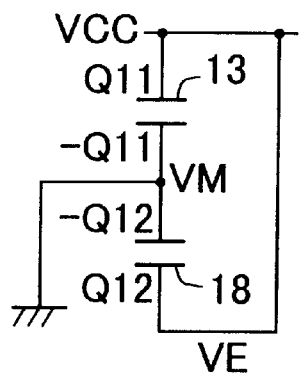
FIGS. 2(A) through 2(C) show the three states of the capacitors shown in FIG. 1.

In an initial state, the address transition detection signal AT is low, and the control signals AIN and *BIN are high. Thereby, the PMOS transistor 21 is off, the NMOS transistor 23 is on, and the voltage VM is at 0V. On the other hand, the output of the inverter 31 is low, the PMOS transistor 321 and the NMOS transistor 322 are on and off, respectively, and the voltage VE is at VCC. FIG. 2(A) shows this initial state of the capacitors 13 and 18. Each of the NMOS capacitor 13 and the PMOS capacitor 18 is an on-state between the drain and the source thereof. Letting the capacities of the NMOS capacitors 13 and 18 be C1 and C2, respectively, the charge Q11 on the VCC-side electrode (gate electrode) of the capacitor 13 and the charge Q12 on the VE-side electrode (electrode between the source and drain) of the capacitor 18 can be ex pressed using the equations:

$$Q11 = C1 \cdot VCC \quad (1)$$

$$Q12 = C2 \cdot VCC \quad (2)$$

(B) Drop of voltage VE

The output of the row address resistor 40 changes on a rise of the clock φ, and in response to this change the address transition detecting circuit 42 generate a pulse of the signal AT. In response to a rise on the AT, the control signal AIN goes low. Thereby, the NMOS transistor 23 is turned off, and the node of the voltage VM immediately turns to a floating state. Next, the PMOS transistor 321 and the NMOS transistor 322 are turned off and on, respectively, and the voltage VE drops to 0V, and following up this, the voltage VM drops from 0V to –α·VCC.

Figure 8:
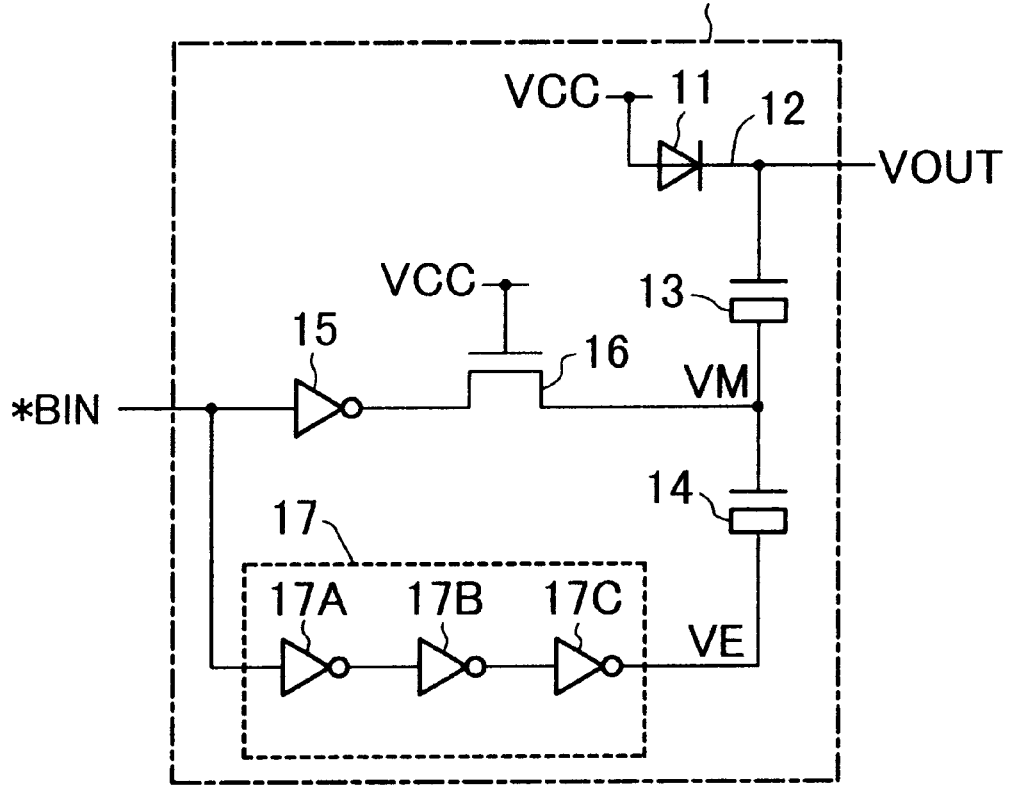
FIG. 8 is a circuit diagram showing a prior-art voltage boosting circuit.

In the prior art, in FIG. 8, the voltage VM is raised with providing a current through the NMOS transistor 16S the VM reaches (VCC−Vth) slowly and when having reached the node of the VM becomes a floating state, while in the present embodiment since the node of the voltage VM immediately changes to a floating state and then the voltage VE drops, the operation speed of the change is higher than the prior art.

Figure 2B:
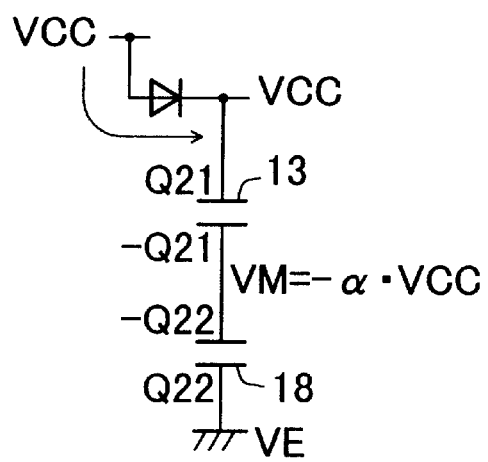

Since the diode 22 is connected between the node of the voltage VM and the NMOS transistor 23, when the voltage VM becomes negative, the current from the ground line to the node of the VM is prevented, whereby the floating state of the node of the VM is maintained. If the voltage VOUT is lowered from VCC due to dropping of the voltage VM, a current flows from the power supply line at VCC via an on-state diode 11 to the output line 12, therefore the voltage VOUT is maintained at VCC. FIG. 2(B) shows the state of the capacitors 13 and 18 where the charge Q11 is changed to Q21, and the charge Q12 to Q22 and the voltage VM has been stabilized. In this state, the following equations hold.

$$Q21 = C1(1+\alpha)VCC \quad (3)$$

$$Q22 = C2 \cdot \alpha \cdot VCC \quad (4)$$

Since the node of the voltage VM is in a floating state, −Q11−Q12=−Q21−Q22 holds. From this and the above equations (1) through (4), the following equation is derived.

$$\alpha = C2/(C1+C2) \quad (5)$$

(C) Boosting VOUT

Figure 2C:
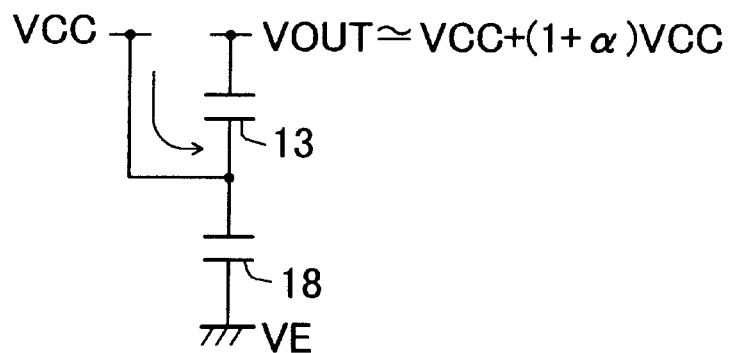

Next, in response to the fall of the address transition detection signal AT, the control signal *BIN goes low, and the PMOS transistor 21 is turned on, whereby the voltage VM is raised from −α·VCC to almost VCC. Meanwhile, since the PMOS capacitor 18 is turned off between the source and the drain thereof, the capacity C2 is reduced, that is, the capacitive load to be driven by the circuit 20 is reduced, whereby the raising of the voltage VM becomes faster than in the case where a normal capacitor is used in place of the PMOS capacitor 18. Following up this raising of the voltage VM, the voltage VOUT is boosted by approximately (1+α)VCC to be VOUT≈VCC(2+α) with the diode 11 being off. FIG. 2(C) shows the capacitors 13 and 18 in this state.

In order to return to the initial state before the next pulse of the address transition detection signal AT comes, both the control signals AIN and *BIN are returned to high, whereby the NMOS transistor 23 is turned on, the PMOS transistor 21 is turned off, and the voltage VM is dropped from VCC to 0V. Following up this drop, the voltage VOUT also drops by VCC, so that VOUT≈VCC(1+α). Even when the row address changes, if the word line WL is not selected by the row address decoder 41, the voltage VOUT is boosted with repeating the above operation. If one time boosting operation of the voltage VOUT is insufficient at power on of the memory device 1, for example, a pulse train of dummy signal AT is generated, and provided to the middle point voltage control 20 to get a target value of the voltage VOUT.

Figure 4:
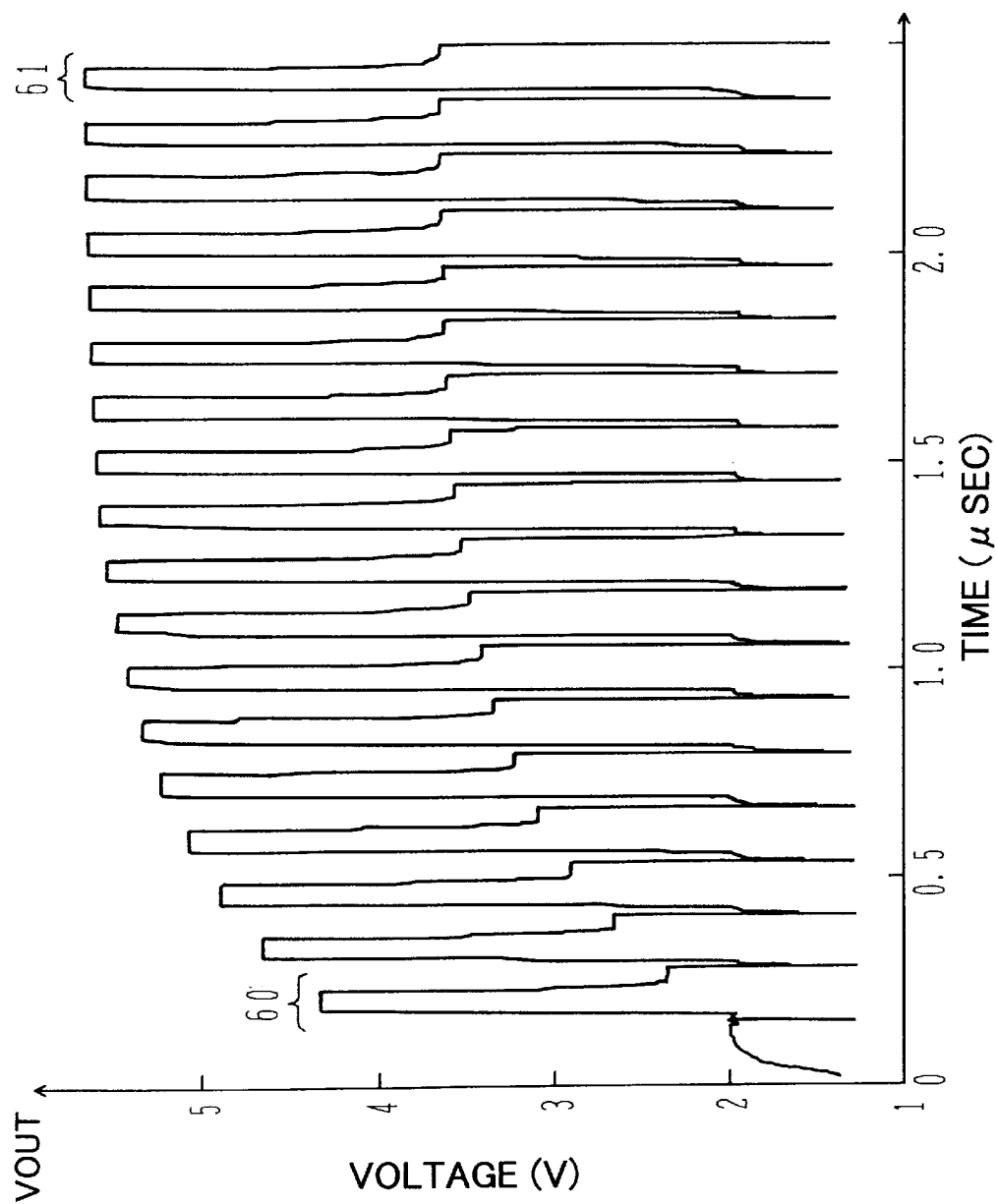
FIG. 4 is a simulated waveform diagram of the boosted voltage VOUT when boosting operation is repeated with the output being open end.
Figure 5:
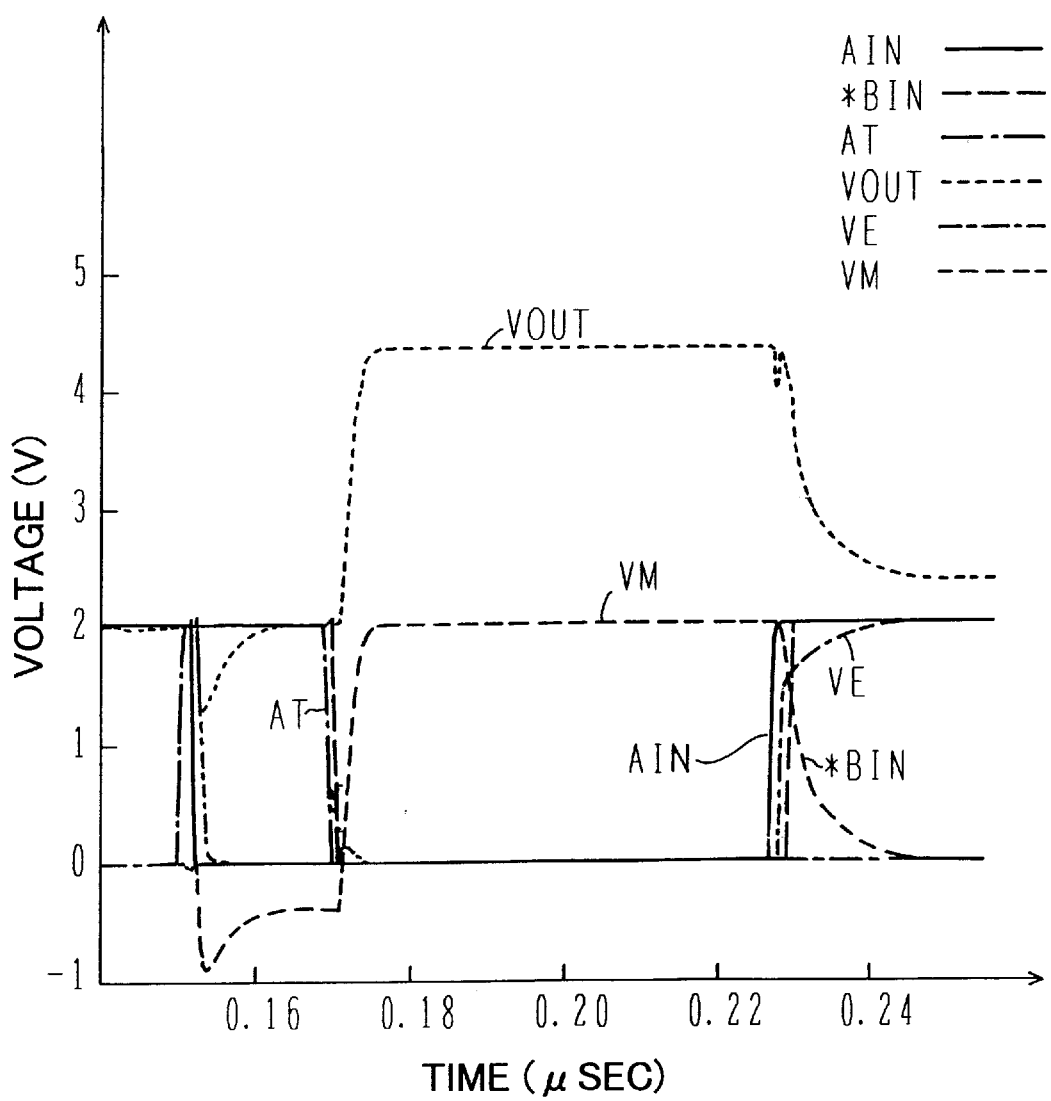
FIG. 5 is a simulated waveform diagram of the voltage boosting circuit showing part associated with portion 60 in FIG. 4 in detail.
Figure 6:
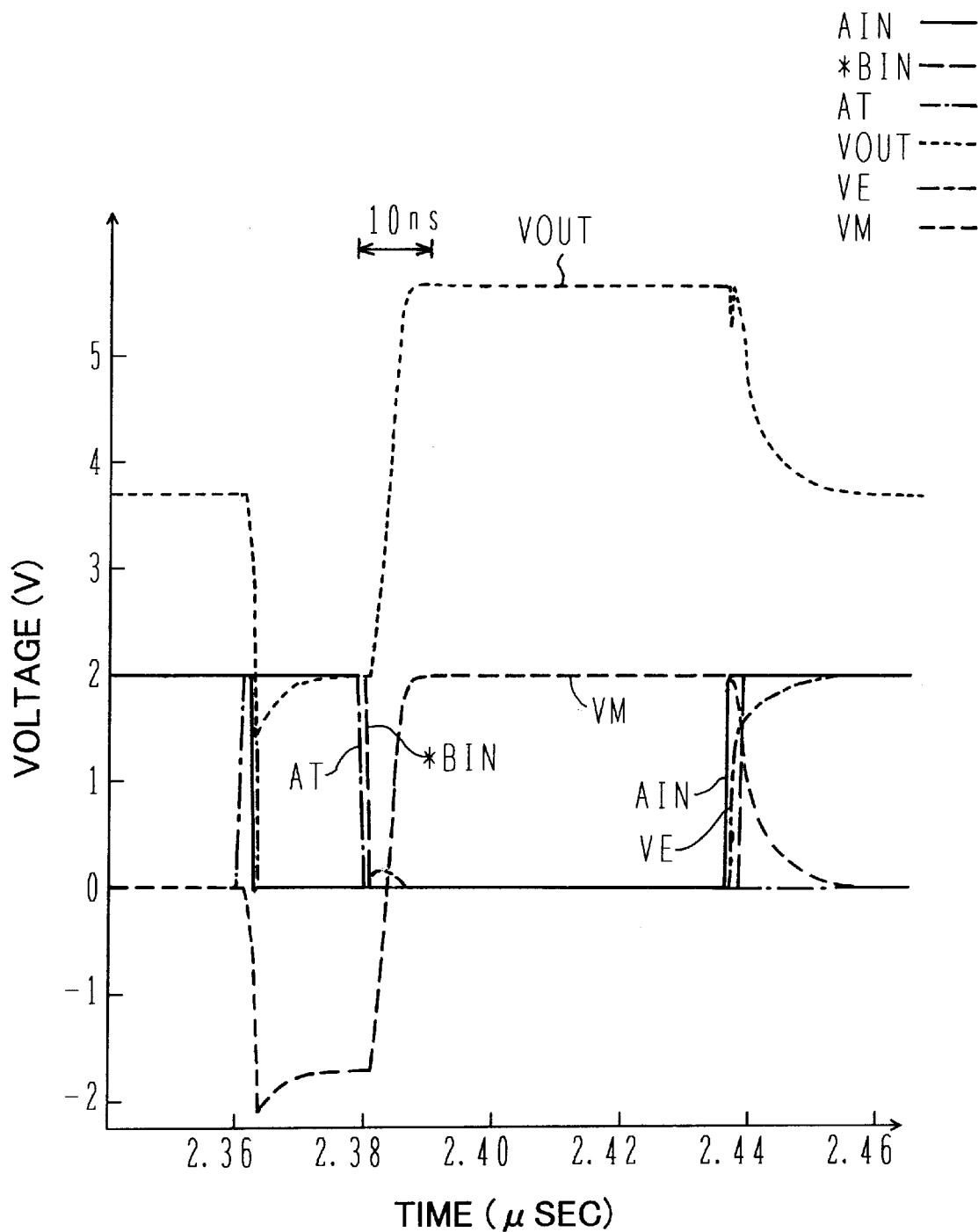
FIG. 6 is a simulated waveform diagram of the voltage boosting circuit showing part associated with portion 61 in FIG. 4 in detail.
Figure 7:
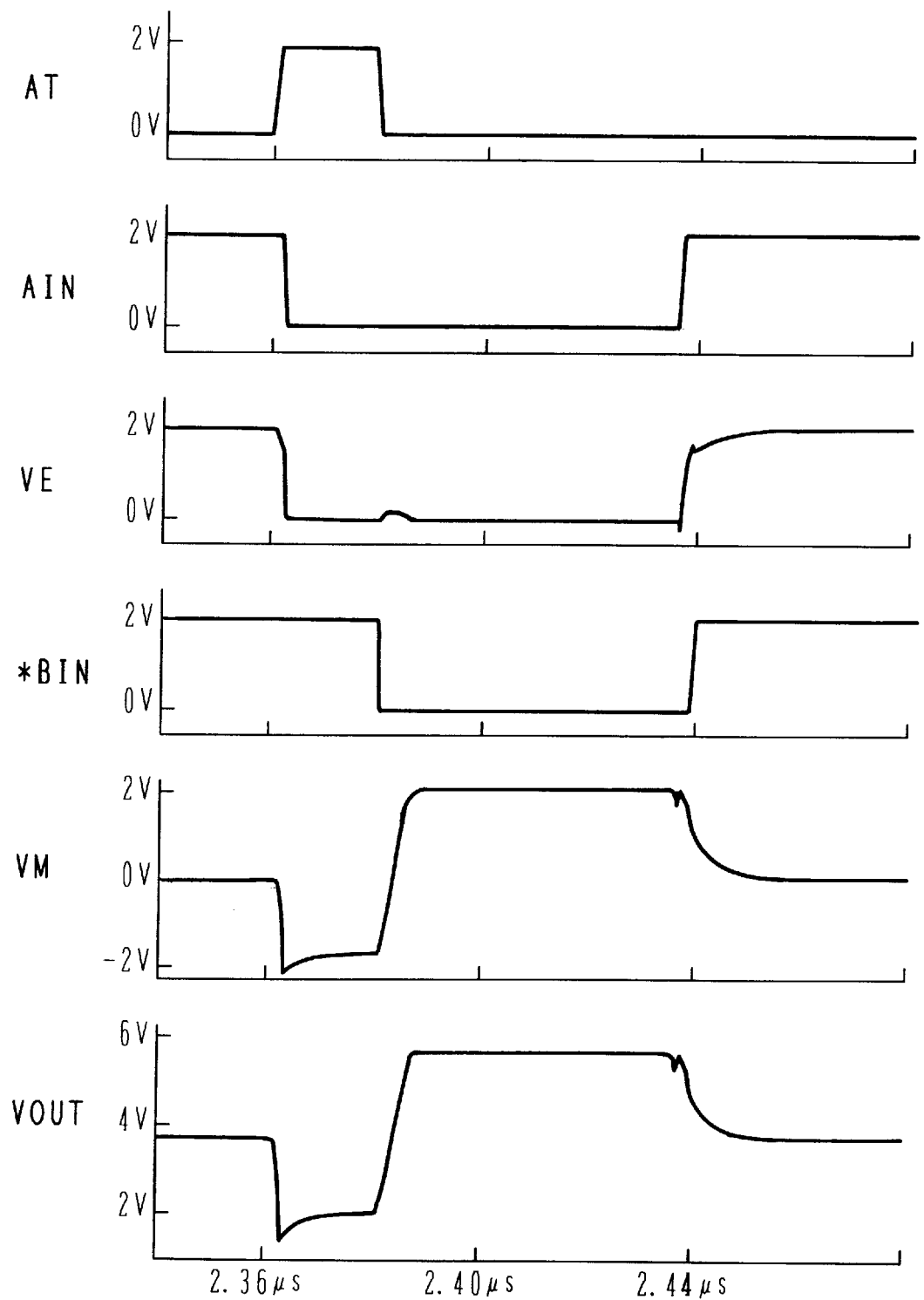
FIG. 7 are timing charts in which the individual waveforms of FIG. 6 are separated and the vertical axis is compressed.
Figure 9:
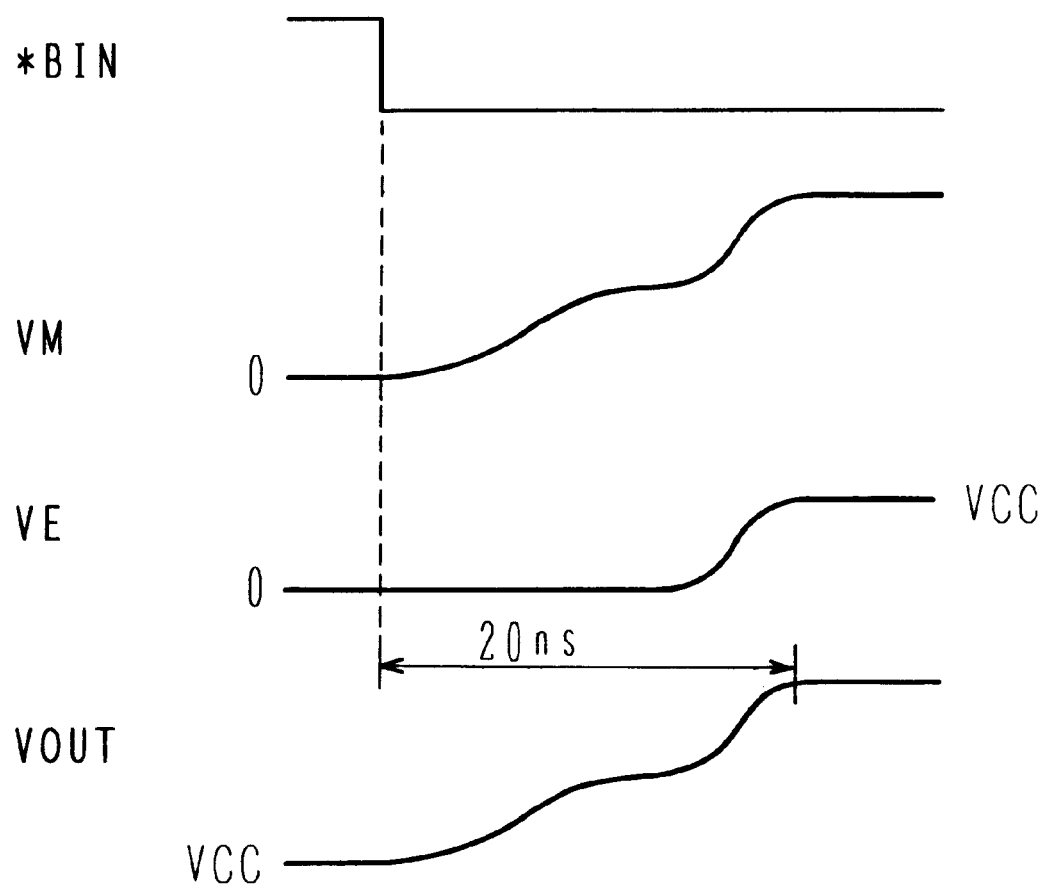
FIG. 9 are time charts showing the operation of the circuit of FIG. 8.

FIG. 4 shows a result of the simulation of the voltage VOUT in such a repeated operation. The condition of the simulation is C2/C1=4/9, namely α≈0.3, and VCC=2.0V and the boosted output being open end. FIG. 5 shows simulated waveforms of the voltage boosting circuit at part associated with portion 60 in FIG. 4 in detail. FIG. 6 shows simulated waveforms of the voltage boosting circuit at part associated with portion 61 in FIG. 4 in detail. FIG. 7 are timing charts in which the individual waveforms of FIG. 6 are separated and the vertical axis is compressed. These simulation results show that the voltage VOUT is boosted faster than in the prior art. Although the rise time of the voltage VOUT depends on the condition, if it is off-load, for example, the rise time is 10 ns (see FIG. 6) in the present invention and is relatively short in comparison with 20 ns in the prior art (see FIG. 9).

Although a preferred embodiment of the present invention has been described, it is to be understood that the invention is not limited thereto and that various changes and modifications may be made without departing from the spirit and scope of the invention.

For example, transistor switches may be used in place of the diodes 11 and/or 22 as switching elements with each switch being turned off for a time when reverse-flow must be prevented.

If the source voltages for the PMOS transistors 21 and 321 and NMOS transistors 23 and 322 are determined as shown in FIG. 1, the structure becomes the simplest, however, since these source voltages may be determined so as to be able to boost the voltage VOUT. Namely, it is enough to meet the relationships in claim 1.

In addition, the capacitors 13 and 18 are not limited to MOS capacitors.

Furthermore, the voltage boosting circuit of the present invention can be used as a power supply circuit for other than the word line driving voltage.

What is claimed is:

1. A voltage boosting circuit comprising:
   a first capacitor having first and second electrodes mutually isolated, said first electrode being a boosted voltage output;
   a switching element coupled between a first power supply conductor and said first electrode, for preventing a current from flowing from said first electrode to said first power supply conductor;
   a second capacitor having first and second electrode mutually isolated, said first electrode thereof being coupled to said second electrode of said first capacitor;
   a middle point voltage control circuit for making:
      in a first period, on between said second electrode of said first capacitor and a first reference conductor at a lower voltage than that of said first power supply conductor;
      in a second period after said first period, off between said second electrode of said first capacitor and said first reference conductor; and
      in a third period after said second period, on between said second electrode of said first capacitor and a second power supply conductor at a higher voltage than that of said first reference conductor; and
   an end point voltage control circuit for making:
      in said first period, on between said second electrode of said second capacitor and a third power supply conductor at a higher voltage than that of said first reference conductor; and
      in said second period with being off between said second electrode of said first capacitor and said first reference conductor, on between said second electrode of said second capacitor and a second reference conductor at a lower voltage than that of said third power supply conductor.

2. A voltage boosting circuit according to claim 1, wherein said first, second, and third power supply conductors are conducted mutually, and said first and second reference conductors are conducted mutually.

3. A voltage boosting circuit according to claim 1, wherein said second capacitor is a PMOS capacitor.

4. A voltage boosting circuit according to claim 1, wherein said first capacitor is an NMOS capacitor.

5. A voltage boosting circuit according to claim 1, wherein said middle point voltage control circuit comprises:
- a first switching element connected between said second electrode of said first capacitor and said second power supply conductor; and
- second and third switching elements connected in series between said second electrode of said first capacitor and said first reference conductor, said third switching element being for preventing a current from flowing from said first reference conductor to said second electrode of said first capacitor.

6. A voltage boosting circuit according to claim 5, wherein said first switching element is a PMOS transistor, and said second switching element is an NMOS transistor.

7. A voltage boosting circuit according to claim 5, wherein said third switching element is a diode operatively connected between said second electrode of said first capacitor and said second switching element.

8. A voltage boosting circuit according to claim 5, wherein said end point voltage control circuit comprises a plurality of inverters connected in cascade.

9. A voltage boosting circuit according to claim 8, further comprising a switch control circuit for providing a first control signal to an control input of said first switching element and providing a second control signal to an control input of said second switching element and to an input of said end point voltage control circuit.

10. A semiconductor device including a voltage boosting circuit, said voltage boosting circuit comprising:
- a first capacitor having first and second electrodes mutually isolated, said first electrode being a boosted voltage output;
- a switching element coupled between a first power supply conductor and said first electrode, for preventing a current from flowing from said first electrode to said first power supply conductor;
- a second capacitor having first and second electrode mutually isolated, said first electrode thereof being coupled to said second electrode of said first capacitor;
- a middle point voltage control circuit for making:
  - in a first period, on between said second electrode of said first capacitor and a first reference conductor at a lower voltage than that of said first power supply conductor;
  - in a second period after said first period, off between said second electrode of said first capacitor and said first reference conductor; and
  - in a third period after said second period, on between said second electrode of said first capacitor and a second power supply conductor at a higher voltage than that of said first reference conductor; and
- an end point voltage control circuit for making:
  - in said first period, on between said second electrode of said second capacitor and a third power supply conductor at a higher voltage than that of said first reference conductor; and
  - in said second period with being off between said second electrode of said first capacitor and said first reference conductor, on between said second electrode of said second capacitor and a second reference conductor at a lower voltage than that of said third power supply conductor.

11. A semiconductor device according to claim 10, further including a memory circuit, said memory circuit comprising:
- a word line; and
- a switching element connected between said first electrode of said first capacitor and said word line.

* * * * *